US009722538B2

(12) United States Patent
Murata et al.

(10) Patent No.: US 9,722,538 B2
(45) Date of Patent: Aug. 1, 2017

(54) CONSTANT VOLTAGE CIRCUIT AND OSCILLATION DEVICE

(71) Applicant: SII Semiconductor Corporation, Chiba-shi, Chiba (JP)

(72) Inventors: Masaya Murata, Chiba (JP); Makoto Mitani, Chiba (JP); Kotaro Watanabe, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 15/015,501

(22) Filed: Feb. 4, 2016

(65) Prior Publication Data

US 2016/0233831 A1     Aug. 11, 2016

(30) Foreign Application Priority Data

Feb. 6, 2015   (JP) ................. 2015-022427

(51) Int. Cl.

| | |
|---|---|
| H03B 5/32 | (2006.01) |
| H03B 5/36 | (2006.01) |
| H03L 5/00 | (2006.01) |
| H03L 1/02 | (2006.01) |
| H03L 7/08 | (2006.01) |

(52) U.S. Cl.
CPC .............. *H03B 5/364* (2013.01); *H03L 1/02* (2013.01); *H03L 5/00* (2013.01); *H03L 7/0802* (2013.01); *H03B 2200/0082* (2013.01)

(58) Field of Classification Search
CPC ....... H03L 7/093; H03L 7/0802; H03L 7/085; H03L 7/0995; H03L 7/0891; H03L 2207/05; H03L 7/0805; H03L 7/099; H03L 7/0992; H03L 5/00; H03L 1/02; H03B 5/364; H03B 2200/0082
USPC ................... 331/183, 185, 175, 158, 116 FE
See application file for complete search history.

(56) References Cited

U.S. PATENT DOCUMENTS 6,288,600 B1 *   9/2001   Kadowaki ................ G04F 5/10
323/313

* cited by examiner

*Primary Examiner* — Arnold Kinkead
(74) *Attorney, Agent, or Firm* — Brinks Gilson & Lione

(57) ABSTRACT

Provided are a constant voltage circuit configured to, when a power supply voltage is low, detect a leakage current to output a stable voltage at a power supply voltage level, and a crystal oscillation circuit using the constant voltage circuit. The constant voltage circuit includes a leakage current detection circuit including a PMOS transistor for monitoring a leakage current, which has a gate and a source being grounded. When a leakage current is detected, even with a constant voltage power supply, a voltage sufficient for turning on an output transistor of the constant voltage circuit can be applied to a gate of the output transistor.

6 Claims, 6 Drawing Sheets

CONSTANT VOLTAGE CIRCUIT AND OSCILLATION DEVICE

RELATED APPLICATIONS

This application claims priority under 35 U.S.C. §119 to Japanese Patent Application No. 2015-022427 filed on Feb. 6, 2015, the entire content of which is hereby incorporated by reference.

BACKGROUND OF THE INVENTION

1. Field of the Invention

The present invention relates to an oscillation device including a crystal oscillation circuit, and more particularly, to a constant voltage circuit configured to detect a leakage current when a power supply voltage is low to enable a stable voltage output at a power supply voltage level.

2. Description of the Related Art

FIG. 5 is a block diagram of a related-art oscillation device 100 that is widely used in a clock, electronic equipment, and the like. The related-art oscillation device 100 includes a constant voltage circuit 10 configured to generate a constant output voltage VREG from an input voltage, and a crystal oscillation circuit 20 configured to oscillate a crystal unit XTAL with the generated constant voltage VREG. Note that, in the oscillation device 100, a ground potential is denoted as VDD and a power supply voltage is denoted as VSS.

In the oscillation device 100, in order to reduce a current consumption, it is important to reduce a voltage for driving the crystal oscillation circuit 20 as much as possible. Therefore, the constant voltage circuit 10 is formed so as to output a predetermined constant voltage VREG even when the power supply voltage is equal to or higher than a predetermined voltage. On the other hand, the crystal oscillation circuit 20 has an oscillation stop voltage VDOS that is determined by oscillation characteristics of the crystal unit XTAL, an oscillation inverter, a load capacitance, and the like. Therefore, in the constant voltage circuit 10, it is necessary that an absolute value |VREG| of the constant voltage VREG be larger than an absolute value |VDOS| of the oscillation stop voltage VDOS.

FIG. 6 is a circuit diagram for illustrating the constant voltage circuit 10 of the related-art oscillation device 100. The constant voltage circuit 10 includes a reference voltage circuit 101, a differential amplifier circuit 102, and an output circuit 103.

In the reference voltage circuit 101, a constant current IREF flows to a PMOS transistor MP1 from a depletion type NMOS transistor MD1 as a constant current source to generate a reference voltage VREF. In the differential amplifier circuit 102, the reference voltage VREF is input to an inverting input terminal, and a feedback voltage FB is input to a non-inverting input terminal. The differential amplifier circuit 102 controls a gate voltage of an output transistor MN5 connected to an output terminal NO2 so that the reference voltage VREF and the feedback voltage FB are equal to each other. Therefore, the absolute value |VREG| of the constant voltage output of the constant voltage circuit 10 is a sum of an absolute value |VREF| of the reference voltage and a gate-source voltage Vgs of an NMOS transistor MN6.

When the power supply voltage is low, a voltage at the ground potential VDD level is applied to a gate of the output transistor MN5, and thus, the output voltage VREG of the related-art constant voltage circuit 10 is equal to the power supply voltage VSS (see, for example, Japanese Patent Application Laid-open No. 2001-312320).

However, when a threshold voltage of the MOS transistor is lower than a predetermined value due to a high temperature, manufacture variations, and the like, and when a leakage current of the MOS transistor increases, a drain-source voltage Vds of the PMOS transistor MP1 becomes lower, and a gate-source voltage Vgs of a PMOS transistor MP3 cannot be secured. Further, when the ground potential VDD cannot be sufficiently applied to a gate of an output transistor MN5, or, when the ground potential VDD cannot be sufficiently applied to the gate of the output transistor MN5 due to a leakage current through an NMOS transistor MN3, a gate-source voltage Vgs of the output transistor MN5 cannot be secured and the output transistor MN5 is turned off. It follows that the relationship between the absolute value |VREG| of the constant voltage and an absolute value |VSS| of the power supply voltage is not |VREG|=|VSS| but |VREG|<|VSS|. When |VREG| is smaller than an absolute value |VDOS| of an oscillation stop voltage, the crystal oscillation circuit 20 cannot operate.

SUMMARY OF THE INVENTION

The present invention has been made in view of the problem described above, and an object of the present invention is to provide a constant voltage circuit that is not affected by a leakage current and that enables a stable voltage output at a power supply voltage level when a power supply voltage is low, and to provide a crystal oscillation circuit using the constant voltage circuit.

In order to solve the above-mentioned problem, according to one embodiment of the present invention, the following constant voltage circuit is constructed.

There is provided a constant voltage circuit, including: a differential amplifier circuit to which a reference voltage and a feedback voltage are input; an output transistor configured to output a constant voltage to an output terminal of the constant voltage circuit using an output voltage of the differential amplifier circuit; and a leakage current detection circuit configured to detect a leakage current of a transistor, in which, when the leakage current detection circuit detects that the leakage current exceeds a predetermined value, the leakage current detection circuit increases a gate-source voltage of the output transistor.

According to the one embodiment of the present invention, with the constant voltage circuit, when the leakage current of the transistor exceeds the predetermined value, the leakage current detection circuit may apply a voltage sufficient for turning on the output transistor to a gate thereof. Therefore, a stable voltage at a power supply voltage level may be output. The present invention is particularly effective in a process in which a threshold voltage of a MOS transistor is decreased for the purpose of reducing a constant voltage output to reduce a current consumption, or in an oscillation circuit in which a channel length of a MOS transistor is reduced for the purpose of reducing a chip area of an IC.

DETAILED DESCRIPTION OF THE PREFERRED EMBODIMENTS

Figure 1:
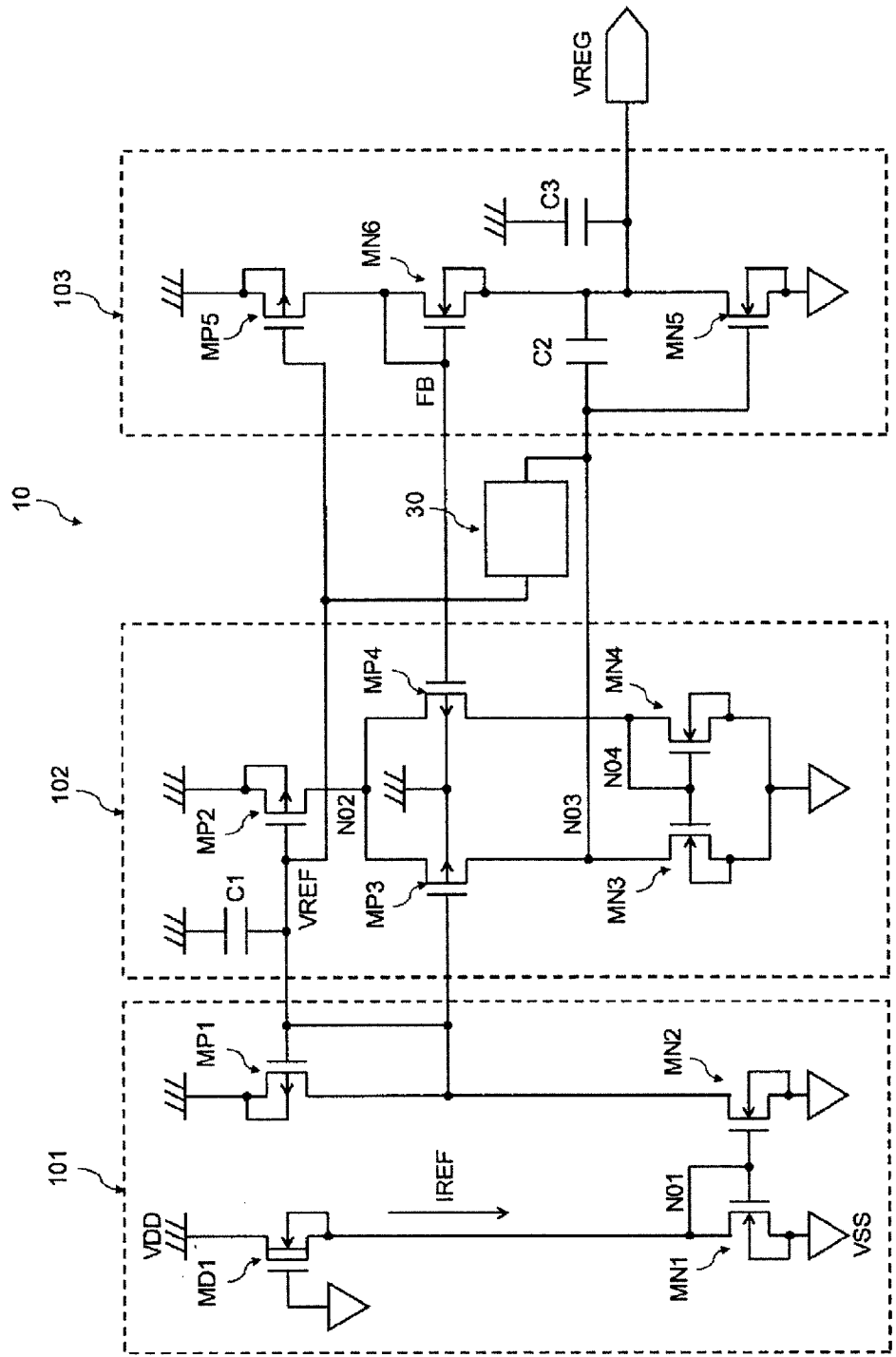
FIG. 1 is a circuit diagram for illustrating a constant voltage circuit according to a first embodiment of the present invention.

FIG. 1 is a circuit diagram for illustrating a constant voltage circuit 10 according to a first embodiment of the present invention. The constant voltage circuit 10 includes a reference voltage circuit 101, a differential amplifier circuit 102, an output circuit 103, and a leakage current detection circuit 30.

The reference voltage circuit 101 includes a depletion type NMOS transistor MD1, NMOS transistors MN1 and MN2, and a PMOS transistor MP1. The depletion type NMOS transistor MD1 operates as a constant current source. The NMOS transistor MN1 and the NMOS transistor MN2 are current mirror connected, and a constant current IREF also flows through the NMOS transistor MN2. A gate and a drain of the PMOS transistor MP1 are connected to each other, and a source of the PMOS transistor MP1 is grounded. Therefore, in the reference voltage circuit 101, the constant current IREF flows through the PMOS transistor MP1 from the depletion type NMOS transistor MD1 as the constant current source to generate a reference voltage VREF.

The differential amplifier circuit 102 includes a PMOS transistor MP2, PMOS transistors MP3 and MP4 that form a differential pair, and NMOS transistors MN3 and MN4 that form a current mirror. The constant current IREF flows through the PMOS transistor MP2 that forms a current mirror with the PMOS transistor MP1 as an operating current.

The output circuit 103 includes a PMOS transistor MP5 and output transistors MN5 and MN6. A gate of the output transistor MN5 is connected to a drain of the PMOS transistor MP3 as an output N03 of the differential amplifier circuit 102, a source of the output transistor MN5 is connected to the power supply voltage VSS, and a drain of the output transistor MN5 is connected to an output VREG of the constant voltage circuit 10. A gate of the NMOS transistor MN6 is connected to a drain thereof to be an input to the PMOS transistor MP4 as a non-inverting input terminal of the differential amplifier circuit 102, and a source of the NMOS transistor MN6 is connected to the output VREG of the constant voltage circuit 10. A gate of the PMOS transistor MP5 is connected to the gate and the drain of the PMOS transistor MP1, and a source of the PMOS transistor MP5 is grounded. The constant current IREF flows through the PMOS transistor MP5 that forms a current mirror with the PMOS transistor MP1.

The reference voltage VREF is input to a gate of the PMOS transistor MP3 as an inverting input terminal in the differential pair in the differential amplifier circuit 102. A drain voltage of the PMOS transistor MP5, that is, a feedback voltage FB, is input to a gate of the PMOS transistor MP4 as the non-inverting input terminal. The output N03 of the differential amplifier circuit 102 is input to the gate of the output transistor MN5, and thus, the gate potential N03 of the output transistor MN5 is controlled so that the reference voltage VREF and the feedback voltage FB finally become equal to each other. Therefore, an absolute value |VREG| of the constant voltage output of the constant voltage circuit 10 is a sum of an absolute value |VREF| of the reference voltage and a gate-source voltage Vgs of the NMOS transistor MN6, which is expressed as |VREG|=|VREF|+Vgs=α|Vtp|+βVtn, where Vtp is a threshold voltage of the PMOS transistor, Vtn is a threshold voltage of the NMOS transistor, and α and β are predetermined constants. On the other hand, when the power supply voltage is low in a normal state in which a leakage current does not flow, the PMOS transistors MP2 and MP3 can secure sufficient gate-source voltages Vgs to be turned on, and thus, the gate potential of the output transistor MN5 is a ground potential VDD. A gate-source voltage Vgs of the output transistor MN5 can be secured to turn on the output transistor MN5. Thus, |VREG|=|VSS| is achieved.

Figure 2:
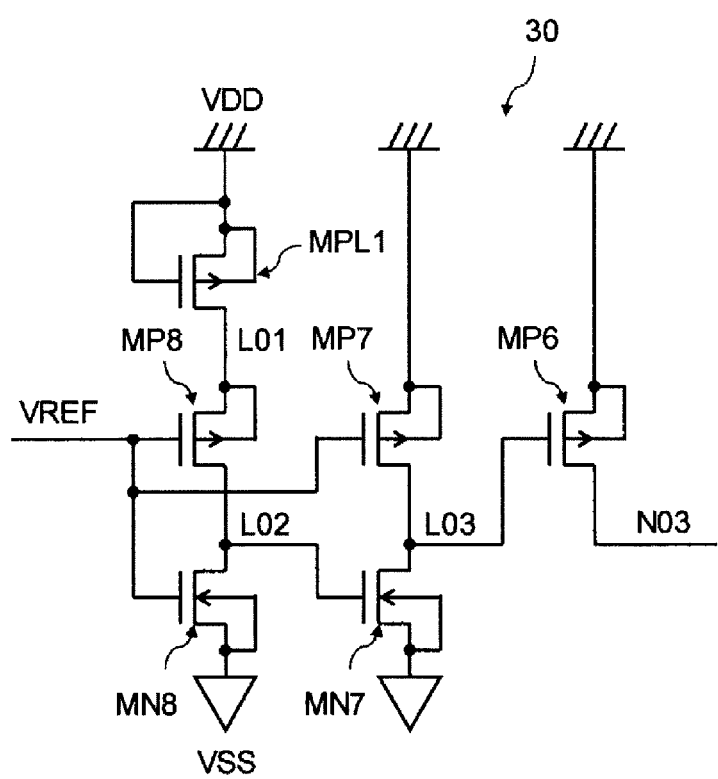
FIG. 2 is a circuit diagram for illustrating a leakage current detection circuit according to the first embodiment.

The leakage current detection circuit 30 is connected between the reference voltage VREF and the output N03 of the differential amplifier circuit 102. FIG. 2 is a circuit diagram for illustrating the leakage current detection circuit 30.

The leakage current detection circuit 30 includes a PMOS transistor MPL1 for monitoring a leakage current, PMOS transistors MP6, MP7, and MP8, and NMOS transistors MN7 and MN8. A gate and a source of the PMOS transistor MPL1 for monitoring a leakage current are grounded, and a drain of the PMOS transistor MPL1 for monitoring a leakage current is connected to a source of the PMOS transistor MP8. A gate of the PMOS transistor MP8 is connected to the reference voltage VREF, and a drain of the PMOS transistor MP8 is connected to a drain of the NMOS transistor MN8. A gate of the NMOS transistor MN8 is connected to the reference voltage VREF, and a source of the NMOS transistor MN8 is connected to the power supply voltage VSS. A gate of the PMOS transistor MP7 is connected to the reference voltage VREF, a source of the PMOS transistor MP7 is grounded, and a drain of the PMOS transistor MP7 is connected to a drain of the NMOS transistor MN7. A gate of the NMOS transistor MN7 is connected to the drain of the PMOS transistor MP8 and the drain of the NMOS transistor MN8, and a source of the NMOS transistor MN7 is connected to the power supply voltage VSS. A gate of the PMOS transistor MP6 is connected to the drain of the PMOS transistor MP7 and the drain of the NMOS transistor MN7, a source of the PMOS transistor MP6 is grounded, and a drain of the PMOS transistor MP6 is connected to the gate N03 of the output transistor MN5 of the constant voltage circuit 10.

Operation of the constant voltage circuit 10 of the oscillation device 100 according to the first embodiment is now described.

The gate and the source of the PMOS transistor MPL1 for monitoring a leakage current of the leakage current detection circuit 30 are grounded, and thus, the PMOS transistor MPL1 for monitoring a leakage current is normally off. Further, the PMOS transistor MPL1 for monitoring a leakage current appropriately adjusts an element size in accordance with a predetermined amount of a leakage current. The predetermined amount of a leakage current herein refers to a condition with which, when the threshold voltage of the MOS transistor is lower than a predetermined value due to an operating environment at a high temperature, manufacture variations, and the like, and when the power supply voltage is low, a drain-source voltage Vds of the PMOS transistor MP1 of the constant voltage circuit 10 becomes lower and a gate-source voltage Vgs of the PMOS transistor MP3 cannot be secured.

When the leakage current exceeds the predetermined amount, a leakage current flows through the PMOS transistor MPL1 for monitoring a leakage current. The gate potential of the PMOS transistor MP8 is the reference voltage VREF, and thus, the flow of the leakage current through the PMOS transistor MPL1 for monitoring a leakage current enables a flow of a smaller one of the leakage current and the constant current IREF.

On the other hand, the NMOS transistor MN8 has, similarly to the PMOS transistor MP8, a gate potential that is the reference voltage VREF and a source potential that is the power supply voltage VSS. In other words, both the PMOS transistor MP8 and the NMOS transistor MN8 are on. Therefore, the transistor that has a higher current driving capability exceeds the other transistor, and applies the potential thereof to the gate of the NMOS transistor MN7 of the following stage. When the power supply voltage is low, it is difficult to sufficiently secure a gate-source voltage Vgs of the NMOS transistor MN8, and thus, a current driving capability of the PMOS transistor MP8 exceeds that of the NMOS transistor MN8, and the PMOS transistor MP8 applies the ground potential VDD to the gate of the NMOS transistor MN7 of the following stage.

On the other hand, the PMOS transistor MP7 has a gate potential that is the reference voltage VREF and a source potential that is the ground potential VDD, and thus, causes the constant current IREF to flow therethrough. In other words, both the PMOS transistor MP7 and the NMOS transistor MN7 are on. When the power supply voltage is low, through adjustment of the element size so that the NMOS transistor MN7 may have a higher current driving capability than the PMOS transistor MP7, the power supply voltage VSS is applied to the gate of the PMOS transistor MP6 of the following stage.

Therefore, when the power supply voltage is low, and when the leakage current exceeds the predetermined amount, the PMOS transistor MP6 is turned on, the gate potential N03 of the output transistor MN5 becomes the ground potential VDD, and the gate-source voltage Vgs of the output transistor MN5 can be secured to turn on the output transistor MN5. Thus, |VREG|=|VSS| is achieved.

When a leakage current exceeding the predetermined amount does not flow, the PMOS transistor MPL1 for monitoring a leakage current is off, and thus, even when the PMOS transistor MP8 is on, a current cannot flow. The source potential of the NMOS transistor MN8 is the power supply voltage VSS, and thus, the on state of the NMOS transistor MN8 applies the power supply voltage VSS to the gate of the NMOS transistor MN7 of the following stage. Next, the gate potential of the NMOS transistor MN7 is the power supply voltage VSS, and thus, the NMOS transistor MN7 is off. The gate potential of the PMOS transistor MP7 is the reference voltage VREF, and the source potential of the PMOS transistor MP7 is the ground potential VDD, and thus, the PMOS transistor MP7 is on. Therefore, the ground potential VDD is applied to the gate of the PMOS transistor MP6 of the following stage.

Therefore, when a leakage current exceeding the predetermined amount does not flow, the PMOS transistor MP6 is off, and thus, the leakage current detection circuit 30 does not operate and does not affect the operation of the constant voltage circuit 10. Further, the leakage current detection circuit 30 does not have a path to cause a current to flow therethrough when not operated, and thus, a current consumption of the constant voltage circuit 10 that is realized according to the present invention does not increase compared with that of the related-art constant voltage circuit 10.

Next, the constant voltage circuit 10 according to a second embodiment of the present invention is described.

Figure 3:
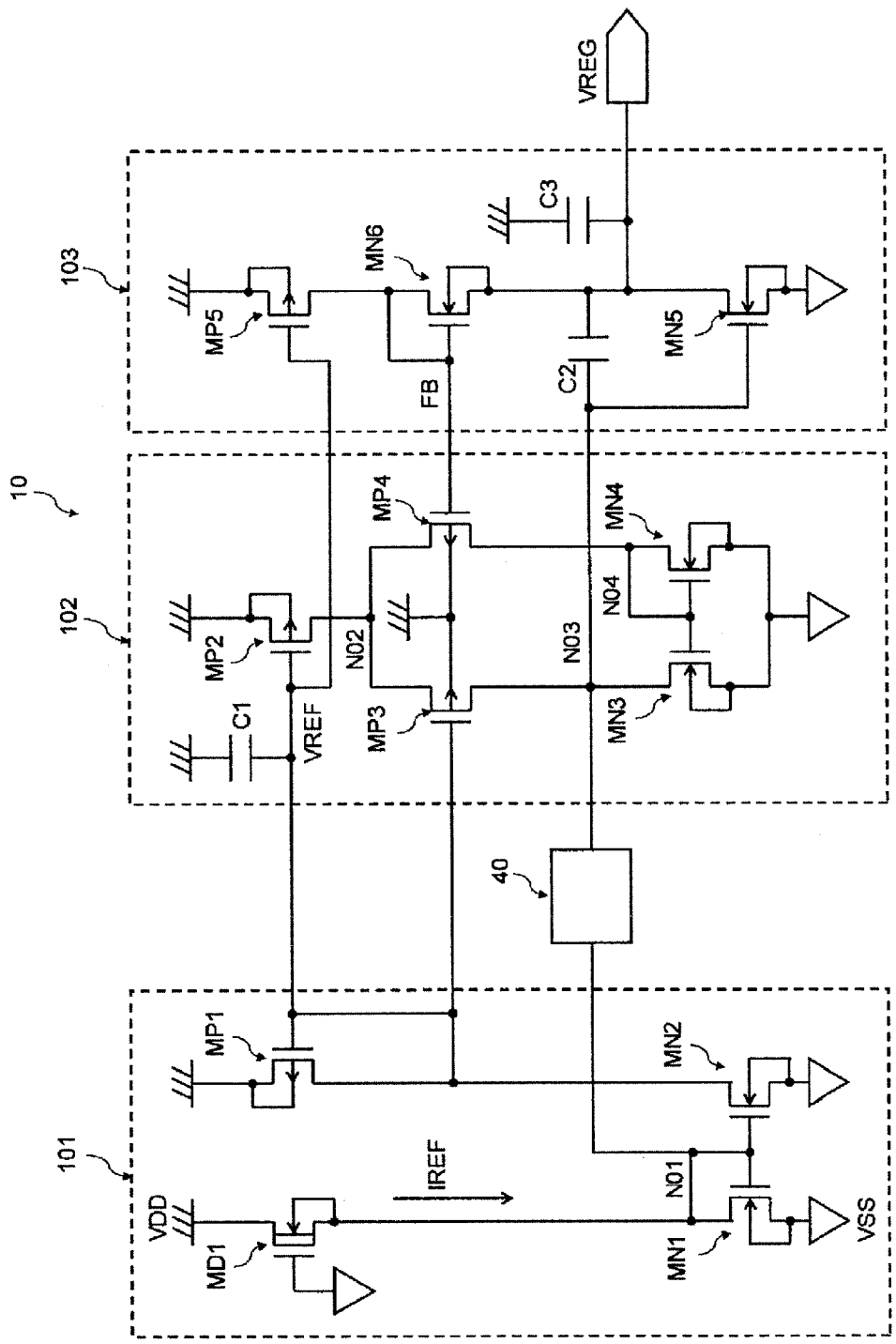
FIG. 3 is a circuit diagram for illustrating an inner structure of a constant voltage circuit according to a second embodiment of the present invention.

FIG. 3 is a circuit diagram for illustrating the constant voltage circuit 10 according to the second embodiment. The constant voltage circuit 10 includes the reference voltage circuit 101, the differential amplifier circuit 102, the output circuit 103, and a leakage current detection circuit 40.

Figure 4:
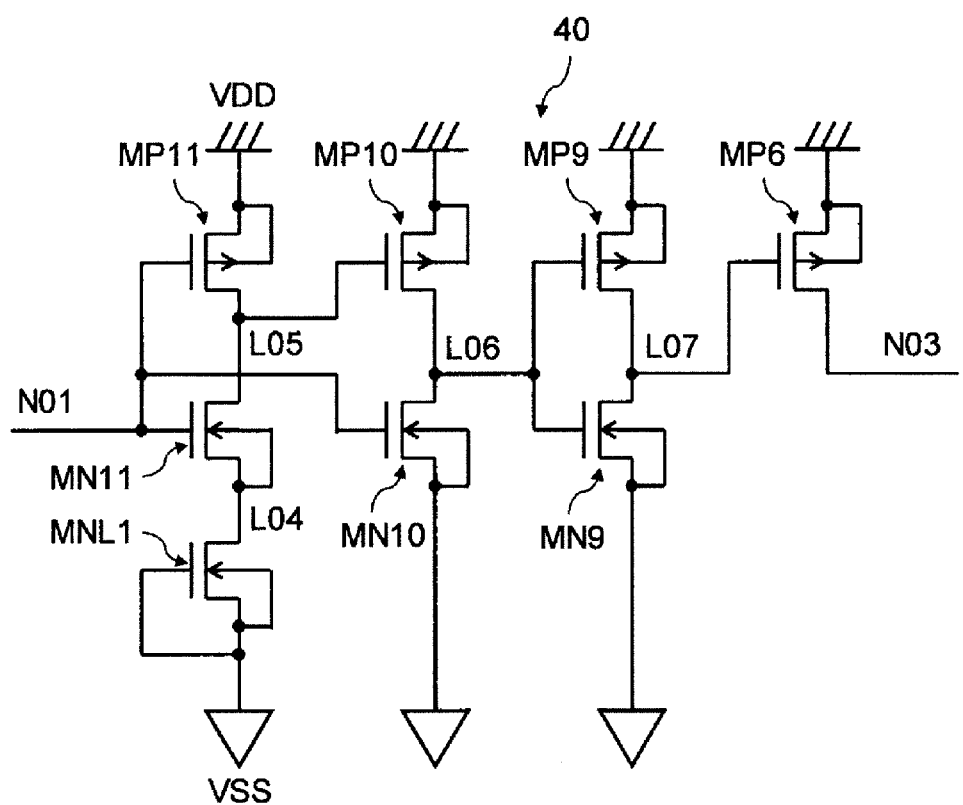
FIG. 4 is a circuit diagram for illustrating a leakage current detection circuit according to the second embodiment.
Figure 5:
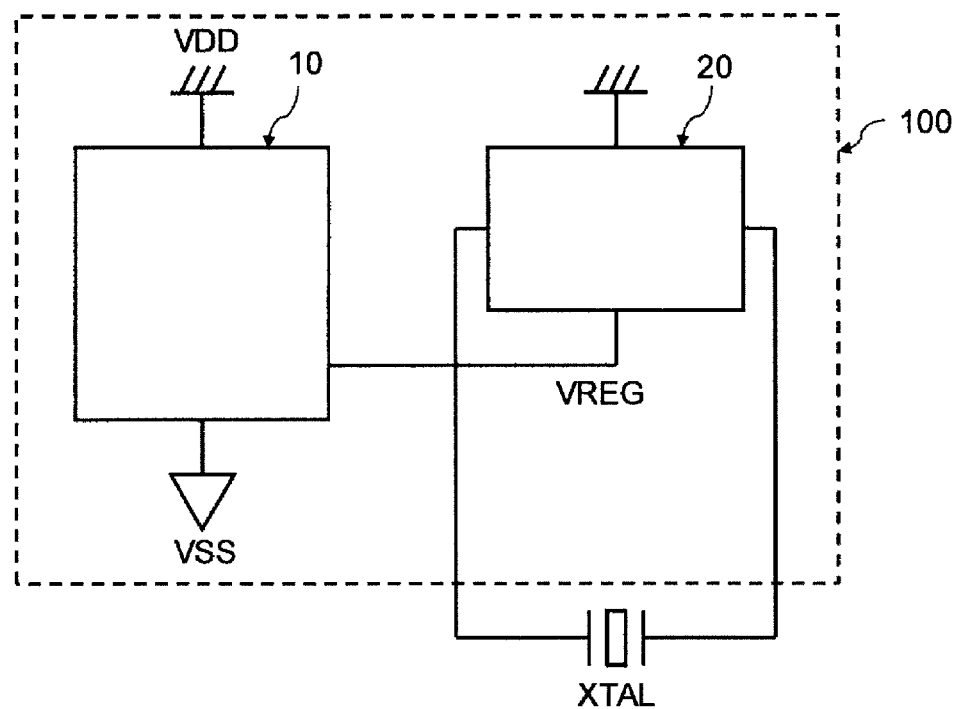
FIG. 5 is a schematic diagram for illustrating an oscillation device in which a constant voltage circuit is used of the present invention.
Figure 6:
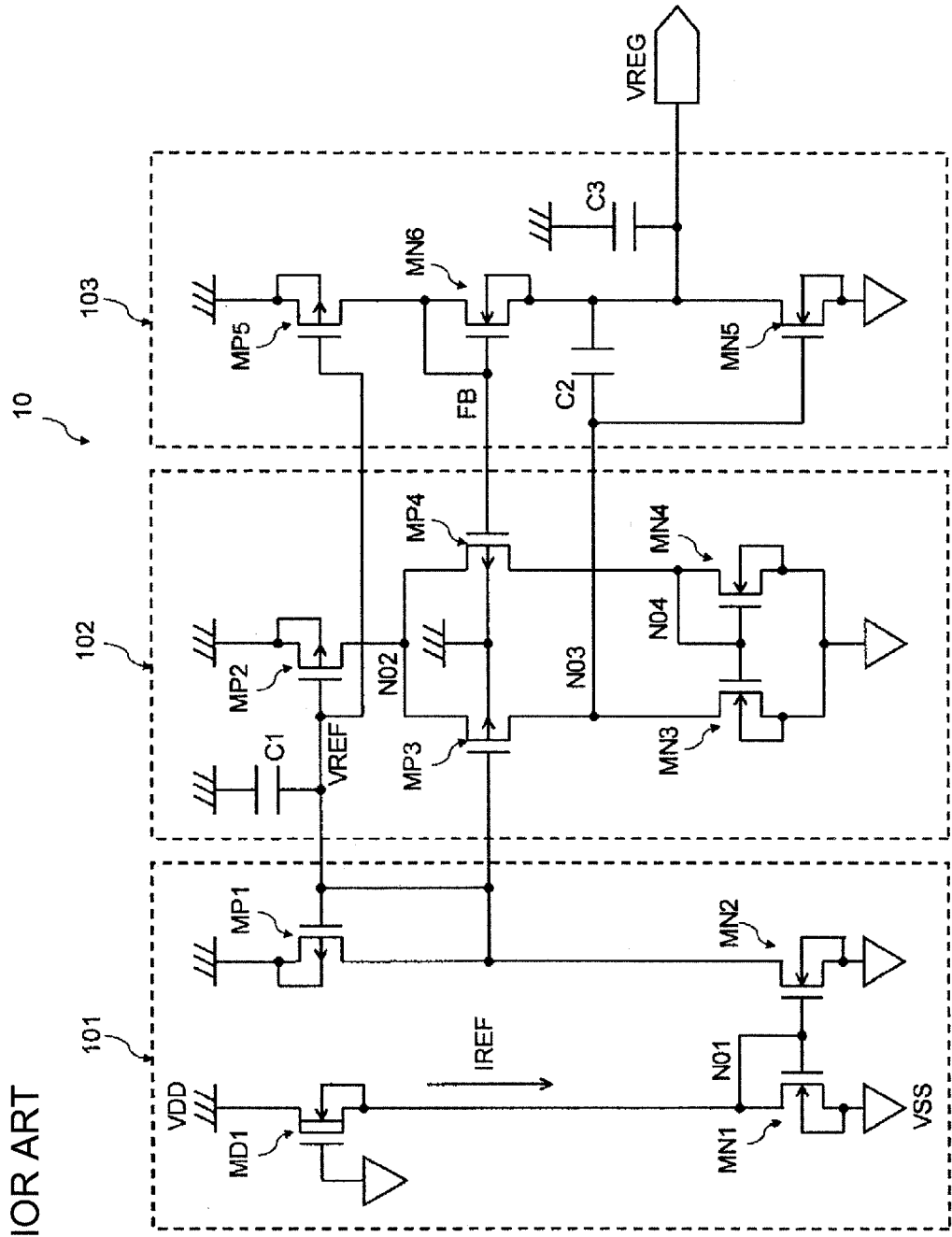
FIG. 6 is a circuit diagram for illustrating a constant voltage circuit of a related-art oscillation device.

The leakage current detection circuit 40 is connected between a reference voltage N01 as a source potential of the depletion type NMOS transistor MD1 forming a constant current source, and the output N03 of the differential amplifier circuit 102. FIG. 4 is a circuit diagram for illustrating the leakage current detection circuit 40.

The leakage current detection circuit 40 includes an NMOS transistor MNL1 for monitoring a leakage current, PMOS transistors MP12, MP9, MP10, and MP11, and NMOS transistors MN9, MN10, and MN11. A gate and a source of the NMOS transistor MNL1 for monitoring a leakage current are connected to the power supply voltage VSS, and a drain of the NMOS transistor MNL1 for monitoring a leakage current is connected to a source of the NMOS transistor MN11. A gate of the NMOS transistor MN11 is connected to the reference voltage N01 and a drain of the NMOS transistor MN11 is connected to a drain of the PMOS transistor MP11. A gate of the PMOS transistor MP11 is connected to the reference voltage N01 and a source of the PMOS transistor MP11 is grounded. A gate of the NMOS transistor MN10 is connected to the reference voltage N01 a source of the NMOS transistor MN10 is connected to the power supply voltage VSS, and a drain of the NMOS transistor MN10 is connected to a drain of the PMOS transistor MP10. A gate of the PMOS transistor MP10 is connected to the drain of the PMOS transistor MP11 and the drain of the NMOS transistor MN11, and a source of the PMOS transistor MP10 is grounded. A gate of the NMOS transistor MN9 is connected to the drain of the PMOS transistor MP10 and the drain of the NMOS transistor MN10, a source of the NMOS transistor MN9 is connected to the power supply voltage VSS, and a drain of the NMOS transistor MN9 is connected to a drain of the PMOS transistor MP9. A gate of the PMOS transistor MP9 is connected to the drain of the PMOS transistor MP10 and the drain of the NMOS transistor MN10, and a source of the PMOS transistor MP9 is grounded. A gate of the PMOS transistor MP12 is connected to the drain of the PMOS transistor MP9 and the drain of the NMOS transistor MN9, a source of the PMOS transistor MP12 is grounded, and a drain of the PMOS transistor MP12 is connected to the gate N03 of the output transistor MN5 of the constant voltage circuit 10.

Operation of the constant voltage circuit 10 of the oscillation device 100 according to the second embodiment is now described.

The gate and the source of the NMOS transistor MNL1 for monitoring a leakage current of the leakage current detection circuit 40 are connected to the power supply voltage VSS, and thus, the NMOS transistor MNL1 for monitoring a leakage current is normally off. Further, the NMOS transistor MNL1 for monitoring a leakage current appropriately adjusts an element size in accordance with a predetermined amount of a leakage current. The predetermined amount of a leakage current herein refers to a condition with which, when the threshold voltage of the MOS transistor is lower than a predetermined value due to an operating environment at a high temperature, manufacture variations, and the like, and when the power supply voltage is low, a flow of the leakage current through the NMOS transistor MN3 of the constant voltage circuit 10 pulls the gate potential of the output transistor MN5 to the power supply voltage VSS side.

When the leakage current exceeds the predetermined amount, a leakage current flows through the NMOS transistor MNL1 for monitoring a leakage current. The gate potential of the NMOS transistor MN11 is the reference voltage N01, and thus, the flow of the leakage current through the NMOS transistor MNL1 for monitoring a leakage current enables a flow of a smaller one of the leakage current and the constant current IREF.

On the other hand, the PMOS transistor MP11 has, similarly to the NMOS transistor MN11, a gate potential that is the reference voltage N01 and a source potential that is the ground potential VDD. In other words, both the NMOS transistor MN11 and the PMOS transistor MP11 are on. Therefore, the transistor that has a higher current driving capability exceeds the other transistor, and applies the potential thereof to the gate of the PMOS transistor MP10 of the following stage. When the power supply voltage is low, it is difficult to sufficiently secure a gate-source voltage Vgs of the PMOS transistor MP11, and thus, a current driving capability of the NMOS transistor MN11 exceeds that of the PMOS transistor MP11, and the NMOS transistor MN11 applies the power supply voltage VSS to the gate of the PMOS transistor MP10 of the following stage.

On the other hand, the NMOS transistor MN10 has a gate potential that is the reference voltage N01 and a source potential that is the power supply voltage VSS, and thus, causes the constant current IREF to flow therethrough. In other words, both the NMOS transistor MN10 and the PMOS transistor MP10 are on. When the power supply voltage is low, through adjustment of the element size so that the PMOS transistor MP10 may have a higher current driving capability than the NMOS transistor MN10, the ground potential VDD is applied to the gate of the PMOS transistor MP9 and the NMOS transistor MN9 of the following stage. The NMOS transistor MN9 is on, and thus, the power supply voltage VSS is applied to the gate of the PMOS transistor MP12 of the following stage.

Therefore, when the power supply voltage is low, and when the leakage current exceeds the predetermined amount, the PMOS transistor MP12 is turned on, the gate potential N03 of the output transistor MN5 becomes the ground potential VDD, and the gate-source voltage Vgs of the output transistor MN5 can be secured to turn on the output transistor MN5. Thus, |VREG|=|VSS| is achieved.

When a leakage current exceeding the predetermined amount does not flow, the NMOS transistor MNL1 for monitoring a leakage current is off, and thus, even when the NMOS transistor MN11 is on, a current cannot flow. The source potential of the PMOS transistor MP11 is the ground potential VDD, and thus, the on state of the PMOS transistor MP11 applies the ground potential VDD to the gate of the PMOS transistor MP10 of the following stage. Next, the gate potential of the PMOS transistor MP10 is the ground potential VDD, and thus, the PMOS transistor MP10 is off. The gate potential of the NMOS transistor MN10 is the reference voltage N01, and the source potential of the NMOS transistor MN10 is the power supply voltage VSS, and thus, the NMOS transistor MN10 is on. Therefore, the power supply voltage VSS is applied to the gate of the PMOS transistor MP9 and the gate of the NMOS transistor MN9 of the following stage. The PMOS transistor MP9 is on, and thus, the ground potential VDD is applied to the gate of the PMOS transistor MP12 of the following stage.

Therefore, when a leakage current exceeding the predetermined amount does not flow, the PMOS transistor MP12 is off, and thus, the leakage current detection circuit 40 does not operate and does not affect the operation of the constant voltage circuit 10. Further, the leakage current detection circuit 40 does not have a path to cause a current to flow therethrough when not operated, and thus, a current consumption of the constant voltage circuit 10 that is realized according to the present invention does not increase compared with that of the related-art constant voltage circuit 10.

Embodiments of the present invention are described above, but the present invention is not limited to those embodiments and to oscillation devices, and the present invention can be implemented in various modes that fall within the gist thereof.

What is claimed is:

1. A constant voltage circuit configured to output a constant voltage for driving an oscillation device including a crystal oscillation circuit, the constant voltage circuit comprising:
   a reference voltage circuit configured to output a reference voltage using a mirror current of a constant current source;
   a differential amplifier circuit to which the reference voltage and a feedback voltage that is based on the constant voltage are input;
   an output transistor configured to output the constant voltage to an output terminal of the constant voltage circuit using an output voltage of the differential amplifier circuit; and
   a leakage current detection circuit, between an output terminal of the reference voltage circuit and a gate of the output transistor, and configured to detect a leakage current of a transistor based on the reference voltage,
   wherein, when the leakage current detection circuit detects that the leakage current exceeds a predetermined value, the leakage current detection circuit increases a gate-source voltage of the output transistor.

2. The constant voltage circuit according to claim 1, wherein the leakage current detection circuit comprises:
   a PMOS transistor configured to monitor a leakage current;
   a first PMOS transistor;
   a first NMOS transistor;
   a second PMOS transistor;
   a second NMOS transistor; and
   a third PMOS transistor,
   wherein a gate and a source of the PMOS transistor for monitoring a leakage current are grounded and a drain of the PMOS transistor for monitoring a leakage current is connected to a source of the first PMOS transistor,
   wherein a gate of the first PMOS transistor is connected to the reference voltage output and a drain of the first PMOS transistor is connected to a drain of the first NMOS transistor,
   wherein a gate of the first NMOS transistor is connected to the reference voltage output and a source of the first NMOS transistor is connected to a power supply voltage,
   wherein a gate of the second PMOS transistor is connected to the reference voltage output, a source of the second PMOS transistor is grounded, and a drain of the second PMOS transistor is connected to a drain of the second NMOS transistor, wherein a gate of the second NMOS transistor is connected to the drain of the first PMOS transistor and the drain of the first NMOS transistor, and a source of the second NMOS transistor is connected to the power supply voltage, and wherein a gate of the third PMOS transistor is connected to the drain of the second PMOS transistor and the drain of the second NMOS transistor, a source of the third PMOS transistor is grounded, and a drain of the third PMOS transistor is connected to the gate of the output transistor.

3. A constant voltage circuit configured to output a constant voltage for driving an oscillation device including a crystal oscillation circuit, the constant voltage circuit comprising:

a reference voltage circuit configured to output a reference voltage using a mirror current of a constant current source;

a differential amplifier circuit to which the reference voltage and a feedback voltage that is based on the constant voltage are input;

an output transistor configured to output the constant voltage to an output terminal of the constant voltage circuit using an output voltage of the differential amplifier circuit; and a leakage current detection circuit between an output terminal of the constant current source and a gate of the output transistor, and configured to detect a leakage current of a transistor based on a voltage of the output terminal of the constant current source, wherein, when the leakage current detection circuit detects that the leakage current exceeds a predetermined value, the leakage current detection circuit increases a gate-source voltage of the output transistor.

4. A constant voltage circuit according to claim 3, wherein the leakage current detection circuit comprises:

an NMOS transistor to monitor a leakage current,
a first NMOS transistor,
a first PMOS transistor,
a second NMOS transistor,
a second PMOS transistor,
a third NMOS transistor,
a third PMOS transistor,
and a fourth PMOS transistor, wherein a gate and a source of the NMOS transistor for monitoring a leakage current are connected to a power supply voltage and a drain of the NMOS transistor for monitoring a leakage current is connected to a source of the first NMOS transistor, wherein a gate of the first NMOS transistor is connected to a source of the constant current source and a drain of the first NMOS transistor is connected to a drain of the first PMOS transistor, wherein a gate of the second PMOS transistor is connected to the drain of the first NMOS transistor and the drain of the first PMOS transistor, and a source of the second PMOS transistor is grounded, wherein a gate of the third NMOS transistor is connected to the drain of the second NMOS transistor and the drain of the second PMOS transistor, a source of the third NMOS transistor is connected to the power supply voltage, and a drain of the third NMOS transistor is connected to a drain of the third PMOS transistor, wherein a gate of the third PMOS transistor is connected to the drain of the second NMOS transistor and the drain of the second PMOS transistor, and a source of the third PMOS transistor is grounded, and wherein a gate of the fourth PMOS transistor is connected to the drain of the third NMOS transistor and the drain of the third PMOS transistor, a source of the fourth PMOS transistor is grounded, and a drain of the fourth PMOS transistor is connected to the gate of the output transistor.

5. An oscillation device, comprising:
the constant voltage circuit of claim 1; and
an oscillation circuit driven by a voltage of the constant voltage circuit.

6. An oscillation device, comprising:
the constant voltage circuit of claim 3; and
an oscillation circuit driven by a voltage of the constant voltage circuit.

* * * * *

UNITED STATES PATENT AND TRADEMARK OFFICE
CERTIFICATE OF CORRECTION

PATENT NO. : 9,722,538 B2  
APPLICATION NO. : 15/015501  
DATED : August 1, 2017  
INVENTOR(S) : Murata et al.

Page 1 of 1

It is certified that error appears in the above-identified patent and that said Letters Patent is hereby corrected as shown below:

In the Claims

In Column 9, Claim 4, Line 35, at beginning of the line, delete "A" and replace with --The--

In Column 9, Claim 4, Line 37, insert --configured-- between "transistor" and "to"

In Column 10, Claim 4, after Line 12, insert two missing paragraphs:
  --wherein a gate of the first PMOS transistor is connected to the source of the constant current source and a source of the first PMOS transistor is grounded,
  wherein a gate of the second NMOS transistor is connected to the source of the constant current source, a source of the second NMOS transistor is connected to the power supply voltage, and a drain of the second NMOS transistor is connected to a drain of the second PMOS transistor,--

Signed and Sealed this
Eleventh Day of June, 2019

Andrei Iancu
*Director of the United States Patent and Trademark Office*